(12) United States Patent
Pöchmüller

(10) Patent No.: US 6,618,836 B1
(45) Date of Patent: Sep. 9, 2003

(54) CONFIGURATION AND METHOD FOR PRODUCING TEST SIGNALS FOR TESTING A MULTIPLICITY OF SEMICONDUCTOR CHIPS

(75) Inventor: Peter Pöchmüller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/642,326

(22) Filed: Aug. 21, 2000

(30) Foreign Application Priority Data

Aug. 20, 1999 (DE) .......................... 199 39 595

(51) Int. Cl.[7] .............................................. G06F 17/50
(52) U.S. Cl. ................................... 716/4; 716/5; 716/6
(58) Field of Search ............................. 371/22.3, 22.1, 371/25.1, 22.5, 22.6, 22.31, 22.32; 395/83.06; 716/1–6; 327/233, 234, 392, 393

(56) References Cited

U.S. PATENT DOCUMENTS

| | | | |
|---|---|---|---|
| 5,127,008 A | * | 6/1992 | Bassett et al. ............... 714/724 |
| 5,627,478 A | * | 5/1997 | Habersetzer et al. ........ 324/763 |
| 5,682,472 A | * | 10/1997 | Brehm et al. ................. 714/25 |
| 5,894,548 A | * | 4/1999 | Horie .......................... 714/30 |

FOREIGN PATENT DOCUMENTS

| | | |
|---|---|---|
| DE | 19653160 A1 | 7/1997 |
| DE | 19757797 A1 | 10/1998 |

* cited by examiner

Primary Examiner—Vuthe Siek
(74) Attorney, Agent, or Firm—Laurence A. Greenberg; Werner H. Stemer; Gregory L. Mayback

(57) ABSTRACT

A configuration for producing test signals for testing semiconductor chips includes a clock signal source for producing a clock signal, and a tester. The test signals are produced on the respective semiconductor chips in a precise temporal sequence with respect to the clock signal. The temporal sequence of the test signals on a respective one of the semiconductor chips is determined from the clock signal. Latches are connected downstream of each of the signal inputs for each of the test signals. A DLL unit uses the clock signal to produce a delayed clock signal to activate the latches. Switches to be driven by a test mode signal are disposed in parallel with the latches. A method for producing test signals for testing semiconductor chips includes the steps of supplying test signals to semiconductor chips in a precise temporal sequence with respect to a clock signal, and determining from the clock signal the temporal sequence of the test signals on each of the semiconductor chips.

5 Claims, 2 Drawing Sheets

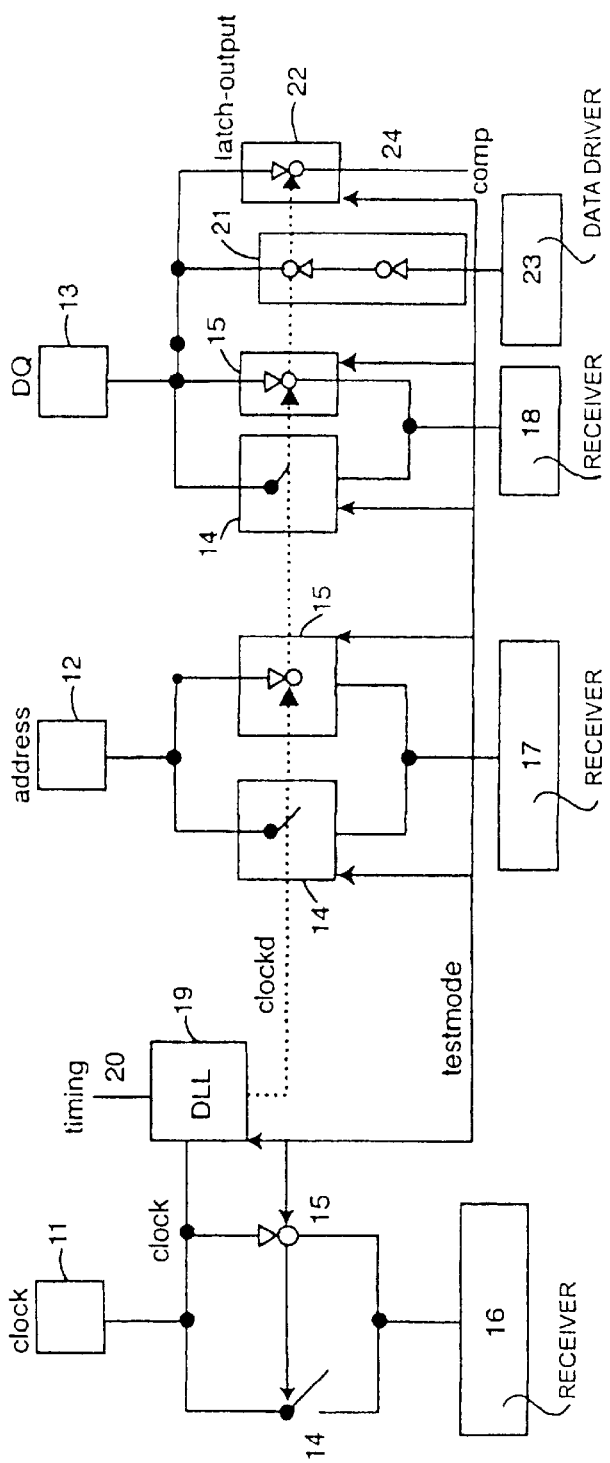
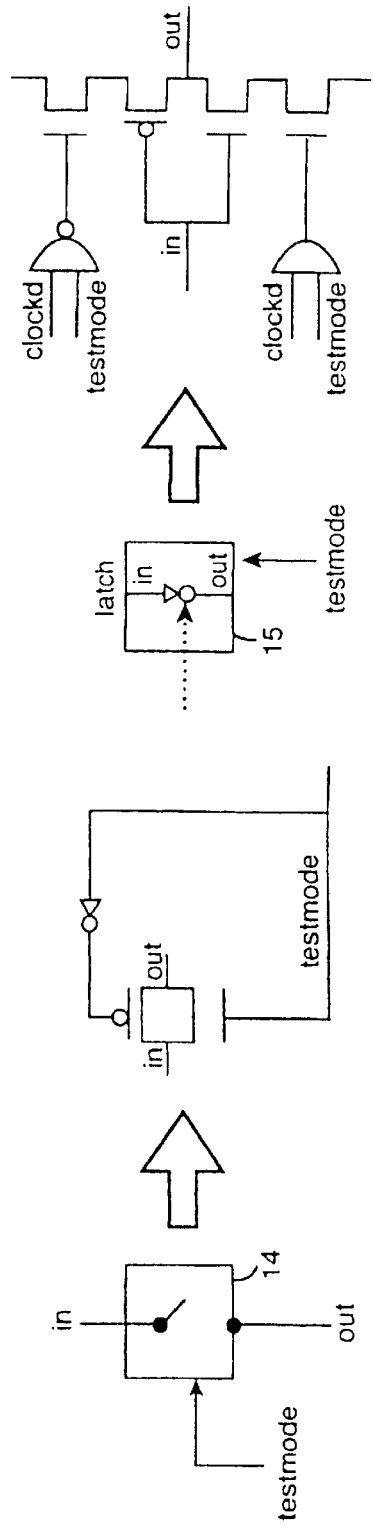
Fig. 1
Fig. 2a
Fig. 2b
Fig. 2c
Fig. 2d

CONFIGURATION AND METHOD FOR PRODUCING TEST SIGNALS FOR TESTING A MULTIPLICITY OF SEMICONDUCTOR CHIPS

BACKGROUND OF THE INVENTION

Field of the Invention

The invention lies in the field of semiconductors. The present invention relates to a configuration and to a method for producing test signals for testing a multiplicity of semiconductor chips, in which the test signals, such as address signals and data signals, can be supplied to the semiconductor chips in a precise temporal relationship with respect to a clock signal.

During the manufacture of integrated semiconductor circuits, such as semiconductor memories in particular, the testing of setup and hold times is one of the most critical procedures, which is ultimately conditional upon the extremely short duration of these test signals. This feature will be explained in more detail below with reference to FIGS. 3 to 5.

FIG. 3 shows a tester 1 connected up to a multiplicity of semiconductor chips 2 to 10, as indicated schematically by dashed lines. The tester 1 provides a clock signal, denoted by the reference "clock" (cf. top half of FIG. 4), and also an address signal, denoted by the reference "address" and a data signal DQ. If the semiconductor chips 2 to 10 are dynamic write/read memories (DRAMs), then the clock signal is used to input into the individual DRAMS the address signal or the data signal DQ during its rising edge. It is now of crucial significance that the address or data signal to be input remains stable during a certain minimum setup and hold time.

The high operating frequencies of such semiconductor memories mean that the demands on the setup and hold times are extremely high. Hence, DRAMs are currently operated at frequencies of up to 400 MHz and above, which results in theoretical times for address and data signals in an order of magnitude of no more than 2.5 ns. In practice, the theoretical value is reduced again to approximately 1 ns, which can be attributed to noise and to signal rise and fall times.

As such, the specification of memory modules provides for very short setup and hold times, which in some cases may be only a few ps. A test to observe performance within these specifications places almost impossible demands on present-day testers, as will be shown below.

By way of example, assuming that a specification is prescribed for setup and hold of 2 and 3 ns, respectively. See FIG. 4. In context, it should be noted that the ideal signal conditions shown in FIG. 4 for the data signal DQ and the address signal cannot be achieved in practice. Instead, conditions as shown in FIG. 5 are to be assumed. For realistic manufacturing and test environments it should be assumed that signal coupling, signal reflections, etc. cause jitter and noise to be present on all signals output by the tester 1. If jitter of 0.5 ns is present in the clock signal output by the tester 1, and, if the same magnitude of the statistically independent jitter also appears on the data signal DQ or the address signal, then it can be assumed that the setup time should really be established somewhere between 1 ns and 3 ns, depending on the actual signal values as shown in the bottom half of FIG. 5. In practice, therefore, a setup time of 1 ns needs to be set on the tester 1. Such a setup time is required because it is the only way to ensure that the modules satisfy a specification of 2 ns because the signals actually applied are in the range from 0 to 2 ns. However, for many modules, the time requirement causes overtesting because the modules are actually operated with a setup time of below 2 ns. As such there is an increased loss of yield.

The situation means that a reliable test yield is possible only to a small extent, which raises the manufacturing costs for the semiconductor chips to an extreme degree.

To counter such difficulties, the trend in the art to date has always been to refine the testers such that they have as little jitter and noise as possible and so that the edges of the respective data and address signals have accuracies up to an order of magnitude of 25 ps. However, such testers are extremely complex and expensive, which undesirably increases the manufacturing costs for the semiconductor chips.

SUMMARY OF THE INVENTION

It is accordingly an object of the invention to provide a configuration and to a method for producing test signals for testing a multiplicity of semiconductor chips that overcomes the hereinafore-mentioned disadvantages of the heretofore-known devices and methods of this general type and that creates a simple configuration and method for producing test signals for testing a multiplicity of semiconductor chips, in which the individual test signals are supplied to the respective semiconductor chips in an extremely precise temporal sequence.

With the foregoing and other objects in view, there is provided, in accordance with the invention, a configuration for producing test signals for testing a plurality of semiconductor chips, including a clock signal source for producing a clock signal, and a tester for supplying test signals to semiconductor chips in a precise temporal sequence with respect to the clock signal, the temporal sequence of the test signals on a respective one of the semiconductor chips to be determined from the clock signal.

Therefore, the path taken by the present invention is completely different than that of the prior art to date: instead of making improvements to the tester itself, the invention provides for the test signals to be applied only to the individual semiconductor chips in the desired precise temporal relationship with respect to the clock signal. Complex measures involving the tester itself are avoided.

The present invention may also advantageously be combined with various existing Built In Self Test (BIST) techniques in order to reduce the external tester equipment to a large extent.

In accordance with a further feature of the invention, each of the semiconductor chips has at least one signal input, and latches are connected downstream of each of the signal inputs for each of the test signals. In accordance with another feature of the invention, the clock signal can be supplied to a delay locked loop (DLL) unit that uses the clock signal to produce a delayed clock signal that activates a latch connected downstream of each signal input for each test signal.

In accordance with an added feature of the invention, a switch that can be driven by a test mode signal may advantageously be provided in parallel with the latch.

With the objects of the invention in view, there is also provided a configuration for producing test signals for testing a plurality of semiconductor chips, including means for supplying test signals to semiconductor chips in a precise temporal sequence with respect to a clock signal, and means for determining from the clock signal the temporal sequence of the test signals on each of the semiconductor chips.

With the objects of the invention in view, there is also provided a method for producing test signals for testing a plurality of semiconductor chips, including supplying test signals to semiconductor chips in a precise temporal sequence with respect to a clock signal, and determining from the clock signal the temporal sequence of the test signals on each of the semiconductor chips.

In accordance with an additional mode of the invention, the semiconductor chips have signal inputs, and latches are connected downstream of each of the signal inputs for each of the test signals, a DLL unit is supplied with the clock signal, and the DLL unit uses the clock signal to produce a delayed clock signal to activate the latches.

In accordance with a concomitant mode of the invention, switches are provided in parallel with the latches, and the switches are driven with a test mode signal.

Thus, for the configuration and method according to the invention, the test signals, such as, in particular, a clock signal, an address signal, or a data signal, are no longer fed, as previously, from a tester to pads on a chip and allocated there to particular signal receivers that return the test signals to the tester after particular operations have been carried out. Instead, the invention provides a suitable tester on the chip itself, which allow the test signals, for a multiplicity of semiconductor chips, to be impressed on the appropriate receivers in a precise temporal relationship with a setup time of 2 ns, for example. The suitable tester includes, in particular, a DLL unit supplying a delayed clock signal that is then supplied to individual latches of the semiconductor chips. The latches and the switches disposed in parallel thereto are provided in the vicinity of the pads on the semiconductor chips. In a normal mode, the switches are turned on and the latches are deactivated, so that the signals can be supplied to the individual signal receivers through the pads. In a test mode operation, the switches are turned off and the latches are activated, which means that the test signals can be supplied to the individual semiconductor chips in a precise temporal sequence. The DLL unit permits a very precise and controlled delay for the delayed clock signal as compared with the clock signal supplied by the tester. Thus, the DLL unit can be used to produce any desired delay between the clock signal and, for example, the address signals and data signals by supplying the delayed clock signal, obtained from the clock signal, to the latches with an appropriate delay. This enables the setup time and hold time for the test signals to be set very precisely and without jitter and noise influences.

Other features that are considered as characteristic for the invention are set forth in the appended claims.

Although the invention is illustrated and described herein as embodied in a configuration and method for producing test signals for testing a multiplicity of semiconductor chips, it is, nevertheless, not intended to be limited to the details shown since various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a schematic and block circuit diagram of the configuration according to the invention;

FIG. 2a is a schematic and block circuit diagram of a switch in FIG. 1;

FIG. 2b is a schematic and block circuit diagram of an alternative embodiment of the switch of FIG. 2a;

FIG. 2c is a schematic and block circuit diagram of a latch in FIG. 1;

FIG. 2d is a schematic circuit diagram of an alternative embodiment of the latch of FIG. 2c;

DESCRIPTION OF THE PREFERRED EMBODIMENTS

Figure 3:
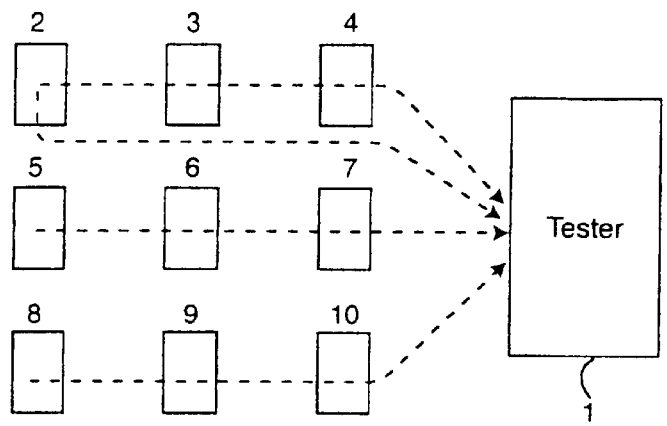
FIG. 3 is a block diagram of a tester having a multiplicity of semiconductor chips according to the invention.
Figure 4:
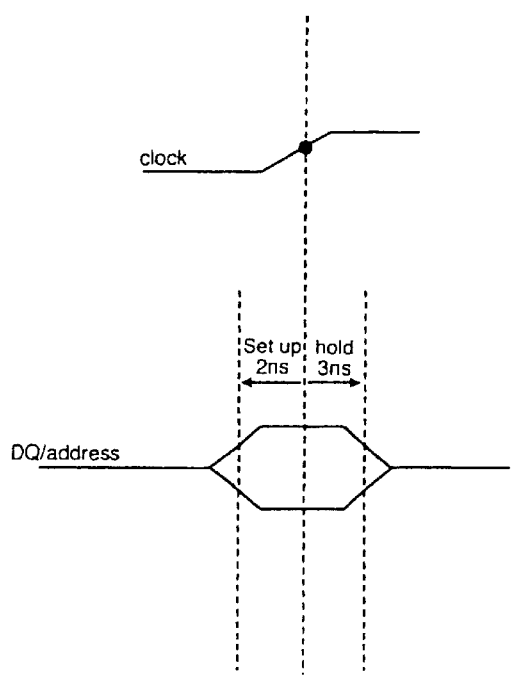
FIG. 4 is a diagrammatic representation of a curve for a clock signal and for a data and address signal.
Figure 5:
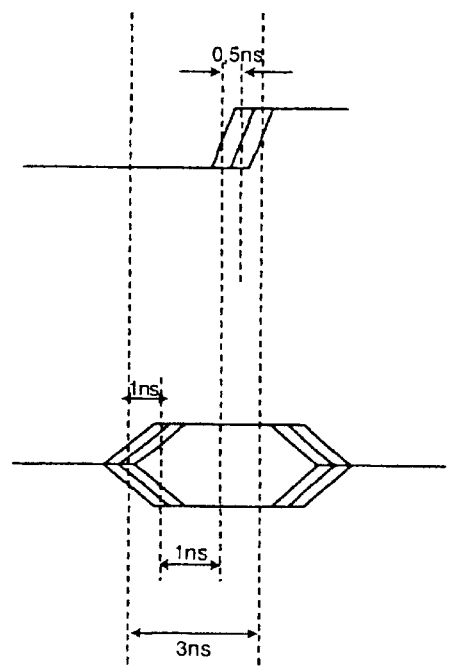
FIG. 5 is a diagrammatic representation of the influence of jitter and noise on a curve for a clock signal and for a data and address signal.

In all the figures of the drawing, sub-features and integral parts that correspond to one another bear the same reference symbol in each case.

Referring now to the figures of the drawings in detail and first, particularly to FIG. 1 thereof, there is shown a pad 11 for a clock signal, a pad 12 for an address signal, and a pad 13 for a data signal DQ. The pads 11, 12, 13 are provided on a semiconductor chip, for example, the semiconductor chip 2 of FIG. 3. The tester 1 supplies the pads 11, 12, 13 with the clock signal, the address signal, and the data signal DQ.

Respectively connected downstream of the pads 11, 12, 13 through, a switch 14 and a latch 15 are a receiver 16 for the clock signal, a receiver 17 for the address signal address, and a receiver 18 for the data signal DQ.

There is, in addition, a DLL unit 19 having an input 20 with a timing signal, denoted by the reference "timing", applied to it, supplied by the tester 1. The DLL unit 19 uses the clock signal (clock) to produce a delayed clock signal (clockd), whose delay depends on the timing signal, denoted by the reference "timing". The delayed clock signal (clockd) is supplied to the latches 15 for the receivers 17, 18.

FIG. 1 also shows latches 21, 22 for a data driver 23 and for an internal comparator (comp) 24, respectively. The units 21 to 24 are preferably used together with BIST techniques. Thus, the internal comparator 24 can be used in a BIST technique to test the latch output signal, denoted by the reference "latch-output", for its correctness. The latch 22 can be used to supply the comparator 24 with the data from the output driver 22 at a precisely defined instant and, thus, to check for the observance of a precise hold time.

In a normal mode, the latches 15 are deactivated, while the switches 14 are turned off. The clock signal (clock), the address signal (address), and the data signal DQ are supplied to the receivers 16 to 18 through the respective pads 11 to 13. If, on the other hand, a test mode is being executed, then the switches 14 are turned off by a test mode signal, denoted by the reference "testmode", and the latches 15 are activated by the DLL unit 19. Thus, as a result of the DLL unit 19 being used to drive the latches with the delayed clock signal (clockd), the test signals that are on the pads 11, 12, 13 (i.e., clock signal (clock), address signal (address), and data signal DQ) are supplied to the receivers 16, 17, 18 in a precise temporal relationship with respect to one another.

FIGS. 2a and 2b show an implementation option for the switch 14. FIG. 2a shows the switch 14 and FIG. 2b shows the switch as a field-effect transistor.

FIGS. 2c and 2d show an implementation option for the latch 15. FIG. 2c shows the latch 15 and FIG. 2d shows the latch as having gates and field-effect transistors.

I claim:

1. A configuration for producing test signals for testing a plurality of semiconductor chips each having at least one signal input, comprising:

a clock signal source for producing a clock signal;

a tester for supplying test signals to semiconductor chips in a precise temporal sequence with respect to the clock signal, the temporal sequence of the test signals on a respective one of the semiconductor chips to be determined from the clock signal;

latches connected downstream of each of the at least one signal input for each of the test signals; and a delay locked loop unit for using the clock signal to produce a delayed clock signal to activate said latches.

2. The configuration according to claim 1, including switches to be driven by a test mode signal, said switches disposed in parallel with said latches.

3. A method for producing test signals for testing a plurality of semiconductor chips having signal inputs, which comprises:

supplying test signals to semiconductor chips in a precise temporal sequence with respect to a clock signal;

determining from the clock signal the temporal sequence of the test signals on each of the semiconductor chips;

connecting latches downstream of each of the signal inputs for each of the test signals;

supplying the clock signal to a delay locked loop unit; and using the clock signal with the delay locked loop unit to produce a delayed clock signal to activate the latches.

4. The method according to claim 3, which further comprises;

providing switches in parallel with the latches; and driving the switches with a test mode signal.

5. A configuration for producing test signals for testing a plurality of semiconductor chips each having at least one signal input, comprising:

means for supplying test signals to semiconductor chips in a precise temporal sequence with respect to a clock signal;

means for determining from the clock signal the temporal sequence of the test signals on each of the semiconductor chips;

latches connected downstream of each of the at least one signal input for each of the test signals; and a delay locked loop unit for using the clock signal to produce a delayed clock signal to activate said latches.

* * * * *